(12) United States Patent
Cheng

(10) Patent No.: US 11,942,491 B2
(45) Date of Patent: Mar. 26, 2024

(54) LIGHT SENSING UNIT AND GaN-BASED IMAGE SENSOR AND DISPLAY APPARATUS THEREOF

(71) Applicant: ENKRIS SEMICONDUCTOR, INC., Jiangsu (CN)

(72) Inventor: Kai Cheng, Jiangsu (CN)

(73) Assignee: ENKRIS SEMICONDUCTOR, INC., Jiangsu (CN)

( * ) Notice: Subject to any disclaimer, the term of this patent is extended or adjusted under 35 U.S.C. 154(b) by 38 days.

(21) Appl. No.: 17/778,963

(22) PCT Filed: Mar. 18, 2021

(86) PCT No.: PCT/CN2021/081548
§ 371 (c)(1),
(2) Date: May 23, 2022

(87) PCT Pub. No.: WO2022/193234
PCT Pub. Date: Sep. 22, 2022

(65) Prior Publication Data
US 2023/0299100 A1     Sep. 21, 2023

(51) Int. Cl.
*H01L 27/146*     (2006.01)
*G09G 3/20*     (2006.01)

(52) U.S. Cl.
CPC ....... *H01L 27/1461* (2013.01); *G09G 3/2003* (2013.01); *H01L 27/14645* (2013.01); *G09G 2360/14* (2013.01)

(58) Field of Classification Search
None
See application file for complete search history.

(56) References Cited

U.S. PATENT DOCUMENTS

| | | | |
|---|---|---|---|
| 2004/0178465 A1* | 9/2004 | Merrill | H01L 31/02162 |
| | | | 257/443 |
| 2017/0272720 A1 | 9/2017 | Oki | |
| 2017/0278826 A1* | 9/2017 | Sugizaki | G02B 5/204 |

FOREIGN PATENT DOCUMENTS

| CN | 104078520 A | 10/2014 |
|---|---|---|
| CN | 106999028 A | 8/2017 |

(Continued)

OTHER PUBLICATIONS

ISA State Intellectual Property Office of the People's Republic of China, International Search Report Issued in Application No. PCT/CN2021/081548, dated Dec. 23, 2021, WIPO, 4 pages.

(Continued)

*Primary Examiner* — Stephen T. Reed
(74) *Attorney, Agent, or Firm* — The Small Patent Law Group LLC; Christopher R. Carroll

(57) ABSTRACT

The present disclosure provides a light sensing unit, a gallium nitride (GaN)-based image sensor, and a display apparatus thereof. The light sensing unit includes: red, green, and blue light sensing sub-units, where materials of a light sensing layer of each of the light sensing sub-units are GaN-based materials containing indium(In). The materials of the light sensing layers may contain different contents of In, such that the light sensing sub-units are enabled to generate or not generate light sensing electrical signals according to different wave lengths of received light. During a GaN-based material growth process, the contents of In in different regions are controlled to prepare the light sensing sub-units at the same time to increase integration degrees of the light sensing unit, the GaN-based image sensor, and the display apparatus containing the light sensing unit to achieve miniaturization.

10 Claims, 2 Drawing Sheets

(56) References Cited

FOREIGN PATENT DOCUMENTS

| | | |
|---|---|---|
| CN | 106653896 B | 5/2018 |
| CN | 108428763 A | 8/2018 |
| CN | 109786418 A | 5/2019 |
| CN | 109950259 A | 6/2019 |
| IN | 107078138 A | 8/2017 |
| JP | 2011203659 A | 10/2011 |

OTHER PUBLICATIONS

ISA State Intellectual Property Office of the People's Republic of China, Written Opinion of the International Searching Authority Issued in Application No. PCT/CN2021/081548, dated Dec. 23, 2021, WIPO, 7 pages. (Submitted with Machine/Partial Translation).

* cited by examiner

US 11,942,491 B2

LIGHT SENSING UNIT AND GaN-BASED IMAGE SENSOR AND DISPLAY APPARATUS THEREOF

CROSS REFERENCE TO RELATED APPLICATION

This application is a U.S. National Phase of PCT Application No. PCT/CN2021/081548 (filed 18 Mar. 2021), the contents of which are incorporated herein by reference in their entirety.

TECHNICAL FIELD

The present disclosure relates to the technical field of semiconductor, and in particular to a light sensing unit and a GaN-based image sensor and a display apparatus thereof.

BACKGROUND

An image sensor converts a light image on a light sensing surface into electrical signals in a corresponding proportional relationship with the light image by using photoelectric conversion function of a photoelectric device. Compared with photosensitive elements of point sources such as photosensitive diode and photosensitive triode, the image sensor is a functional device capable of dividing a light image on its light receiving surface into many small units and converting these small units into usable electrical signals. The image sensors are divided into vidicon camera tubes and solid-state image sensors. Compared with the vidicon camera tube, the solid-state image sensor has the characteristics of small volume, light weight, high integration degree, high resolution, low power consumption, long service life, low price and so on and thus can be widely applied in various industries.

Currently, most of the solid-state image sensors adopt a complementary metal-oxide-semiconductor (CMOS) structure. However, the CMOS image sensors can achieve full color with filters, which is unfavorable for integration of image sensors.

SUMMARY

The object of the present disclosure is to provide a light sensing unit and a GaN-based image sensor and a display apparatus thereof, so as to increase an integration degree and reduce a volume.

In order to achieve the above purpose, a first aspect of the present disclosure provides a light sensing unit, including:
  a red light sensing sub-unit, a green light sensing sub-unit and a blue light sensing sub-unit; where materials of a red light sensing layer of the red light sensing sub-unit, a green light sensing layer of the green light sensing sub-unit, and a blue light sensing layer of the blue light sensing sub-unit are all gallium nitride(GaN)-based materials containing In; the materials of the red light sensing layer, the green light sensing layer and the blue light sensing layer contain different contents of indium (In), enabling the red light sensing sub-unit, the green light sensing sub-unit and the blue light sensing sub-unit to generate or not generate light sensing electrical signals in response to different wave lengths of received light.

Optionally, in a case of blue light irradiation, the red light sensing sub-unit, the green light sensing sub-unit and the blue light sensing sub-unit each generate light sensing electrical signals;

in a case of green light irradiation, the red light sensing sub-unit and the green light sensing sub-unit generate light sensing electrical signals; and in a case of red light irradiation, only the red light sensing sub-unit generates a light sensing electrical signal.

Optionally, the red light sensing sub-unit includes an N type first semiconductor layer and a P type first semiconductor layer, wherein the N type first semiconductor layer and the P type first semiconductor layer are located at both sides of the red light sensing layer respectively; the green light sensing sub-unit includes an N type second semiconductor layer and a P type second semiconductor layer, wherein the N type second semiconductor layer and the P type second semiconductor layer are located at both sides of the green light sensing layer respectively; the blue light sensing sub-unit includes an N type third semiconductor layer and a P type third semiconductor layer, wherein the N type third semiconductor layer and the P type third semiconductor layer are located at both sides of the blue light sensing layer respectively.

Optionally, the content of In in the red light sensing layer is in a range of 0.4-0.6;
  the content of In in the green light sensing layer is in a range of 0.2-0.3;
  the content of In in the blue light sensing layer is in a range of 0.01-0.1.

A second aspect of the present disclosure provides a GaN-based image sensor, including:
  a substrate, where the substrate includes a light sensing processing circuit;
  a metal interconnection layer, located on a surface of the substrate and internally provided with a metal interconnection structure; and
  a plurality of light sensing units according to any one of the above items, located on the metal interconnection layer, where the red light sensing sub-unit, the green light sensing sub-unit and the blue light sensing sub-unit are electrically connected to the light sensing processing circuit through the metal interconnection structure to obtain a blue light incidence signal, a green light incidence signal and a red light incidence signal.

Optionally, the red light sensing sub-unit includes an N type first semiconductor layer and a P type first semiconductor layer, and the N type first semiconductor layer and the P type first semiconductor layer are located at both sides of the red light sensing layer respectively; the green light sensing sub-unit includes an N type second semiconductor layer and a P type second semiconductor layer, and the N type second semiconductor layer and the P type second semiconductor layer are located at both sides of the green light sensing layer respectively; the blue light sensing sub-unit includes an N type third semiconductor layer and a P type third semiconductor layer, and the N type third semiconductor layer and the P type third semiconductor layer are located at both sides of the blue light sensing layer respectively; the N type first semiconductor layer, the N type second semiconductor layer and the N type third semiconductor layer, or the P type first semiconductor layer, the P type second semiconductor layer and the P type third semiconductor layer are connected to the metal interconnection structure to input light sensing electrical signals generated by the red light sensing sub-unit, the green light sensing sub-unit and the blue light sensing sub-unit to the light sensing processing circuit.

Optionally, the light sensing processing circuit detects light sensing electrical signals generated by the light sensing unit;

if the light sensing processing circuit detects light sensing electrical signals at each of the red light sensing sub-unit, the green light sensing sub-unit and the blue light sensing sub-unit in the light sensing unit, the blue light incidence signal is stored;

if the light sensing processing circuit detects light sensing electrical signals only at each of the red light sensing sub-unit and the green light sensing sub-unit in the light sensing unit, the green light incidence signal is stored;

if the light sensing processing circuit detects light sensing electrical signals only at the red light sensing sub-unit in the light sensing unit, the red light incidence signal is stored.

A third aspect of the present disclosure provides a display apparatus including the GaN-based image sensor according to any one of the above items. The display apparatus further includes: a display drive circuit, where an input end of the display drive circuit receives the red light incidence signal, the green light incidence signal and the blue light incidence signal of the light sensing unit in a first region from the light sensing processing circuit, and correspondingly generates a red display drive signal, a green display drive signal and a blue display drive signal;

an output end of the display drive circuit is connected with the metal interconnection structure, and the red display drive signals, the green display drive signals and the blue display drive signals are transmitted to a red light-emitting sub-unit, a green light-emitting sub-unit and a blue light-emitting sub-unit in a second region through the metal interconnection structure; where the red light-emitting sub-unit is the red light sensing sub-unit, the green light-emitting sub-unit is the green light sensing sub-unit and the blue light-emitting sub-unit is the blue light sensing sub-unit.

Optionally, the first region and the second region are a same region, or the first region has a larger area than the second region, the first region has a smaller area than the second region.

Optionally, when the light sensing unit in the first region senses light, the metal interconnection structure is connected with the light sensing processing circuit and disconnected with the display drive circuit; when a light-emitting unit in the second region performs displaying, the metal interconnection structure is disconnected with the light sensing processing circuit and connected with the display drive circuit; the light sensing function and the display function are performed in time-sharing manner.

Compared with the prior arts, the present disclosure has the following beneficial effects.

The red light sensing layer, the green light sensing layer and the blue light sensing layer are made of GaN-based light sensing materials and have different contents of In, such that the corresponding red light sensing sub-unit, green light sensing sub-unit and blue light sensing sub-unit are enabled to generate or not generate light sensing electrical signals according to different wave lengths of received light. In this case, during a GaN-based material growth process, the contents of In in different regions are controlled to prepare the red light sensing sub-unit, the green light sensing sub-unit and the blue light sensing sub-unit at the same time, so as to increase an integration degree of the light sensing unit and an integration degree of the GaN-based image sensor and the display apparatus containing the light sensing unit, helping to achieve miniaturization of the GaN-based image sensor and the display apparatus.

Figure 1:
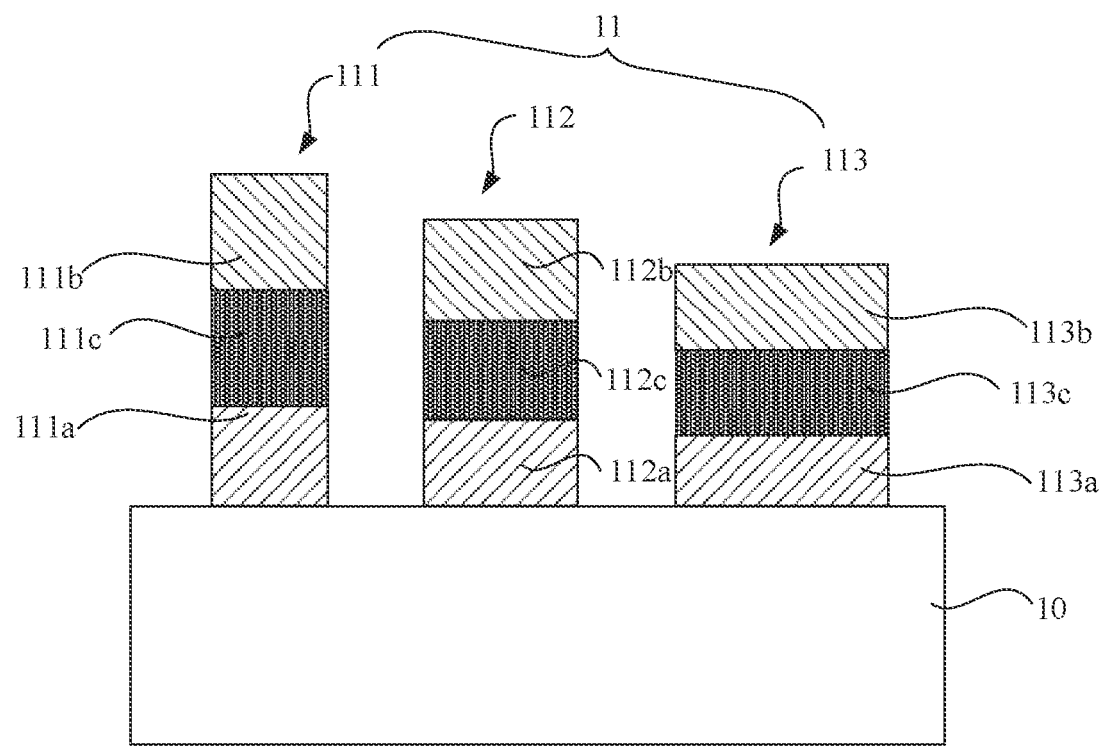
FIG. 1 is a schematic diagram illustrating a sectional structure of a light sensing unit according to a first embodiment of the present disclosure.

In order to help understand the present disclosure all drawing numerals appearing in the present disclosure are listed below:

light sensing unit 11
base 10
red light sensing sub-unit 111
N type first semiconductor layer 111a
P type first semiconductor layer 111b
red light sensing layer 111c
green light sensing sub-unit 112
N type second semiconductor layer 112a
P type second semiconductor layer 112b
green light sensing layer 112c
blue light sensing sub-unit 113
N type third semiconductor layer 113a
P type third semiconductor layer 113b
blue light sensing layer 113c
GaN-based image sensor 1
substrate 21
light sensing processing circuit 210
metal interconnection layer 22
metal interconnection structure 220
display apparatus 2, 2'
display drive circuit 30

DETAILED DESCRIPTION OF THE EMBODIMENTS

In order to make the above objects, features and advantages of the present disclosure clear and understandable, the specific embodiments of the present disclosure will be described in detail below in combination with the accompanying drawings.

FIG. 1 is a schematic diagram illustrating a sectional structure of a light sensing unit according to a first embodiment of the present disclosure.

With reference to FIG. 1, the light sensing unit 11 includes:

a red light sensing sub-unit 111, a green light sensing sub-unit 112 and a blue light sensing sub-unit 113; where materials of a red light sensing layer 111c of the red light sensing sub-unit 111, a green light sensing layer 112c of the green light sensing sub-unit 112, and a blue light sensing layer 113c of the blue light sensing sub-unit 113 are all gallium nitride(GaN)-based materials containing indium(In); the materials of the red light sensing layer 111c, the green light sensing layer 112c and the blue light sensing layer 113c contain different contents or amounts of In, such that the corresponding red light sensing sub-unit 111, green light sensing sub-unit 112 and blue light sensing sub-unit 113 are enabled to generate or not generate light sensing electrical signals in response to different wave lengths of received lights.

The content of In of the red light sensing layer 111c may be greater than the content of In of the green light sensing layer 112c, and the content of In of the green light sensing layer 112c may be greater than the content of In of the blue light sensing layer 113c.

In this embodiment, as shown in FIG. 1, the light sensing unit 11 is formed on a base 10. Before the epitaxial growth of the red light sensing sub-unit 111, the green light sensing sub-unit 112 and the blue light sensing sub-unit 113, a mask layer may be formed on the base 10. The mask layer has three openings respectively corresponding to one light sensing unit 111, and the red light sensing sub-unit 111, the green light sensing sub-unit 112 and the blue light sensing sub-unit 113 correspond to one opening, respectively. The opening corresponding to the red light sensing sub-unit 111 is smaller than the opening corresponding to the green light sensing sub-unit 112, and the opening corresponding to the green light sensing sub-unit 112 is smaller than the opening corresponding to the blue light sensing sub-unit 113. Due to different sizes of the openings, a reactant gas has different flow rates in different openings during growth of the light sensing layers, and thus element In and element Ga have different doping rates, that is, due to different doping rates of the element In, the component In has different proportions in the grown light sensing layers. Specifically, the smaller the opening is, the faster the basic material GaN of the light sensing layer in the opening will grow, and hence, the doping of the element In has better selectivity and the doping rate of the In element is further larger than the doping rate of the element Ga. As a result, the smaller the opening is, the higher the content of element In in the light sensing layer indium gallium nitride (InGaN) is.

The material of the base 10 may be sapphire, silicon carbide, silicon, GaN, aluminium nitride (AlN) or diamond or the like.

The content of In in the red light sensing layer 111c may be in a range of 0.4-0.6, and the wave length of light required for generating light sensing electrical current may be in a range of 400 nm-720 nm.

The content of In in the green light sensing layer 112c may be in a range of 0.2-0.3, and the wave length of light required for generating light sensing electrical current may be in a range of 400 nm-600 nm.

The content of In in the blue light sensing layer 113c may be in a range of 0.01-0.1, and the wave length of light required for generating light sensing electrical current may be in a range of 400 nm-500 nm.

It is noted that, the content of In in the red light sensing layer 111c refers to a percentage of the amount of the substance of In to a sum of the amounts of the substances of all positively-charged elements in the red light sensing layer 111c. For example, if the material of the red light sensing layer 111c is InGaN, the content of In refers to a percentage of the amount of the substance of In to a sum of the amount of the substance of In and the amount of the substance of Ga; and if the material of the red light sensing layer 111c is indium aluminium gallium nitride (InAlGaN) and the content of In refers to a percentage of the amount of the substance of In to a sum of the amount of the substance of In, the amount of the substance of Al and the amount of the substance of Ga.

The content of In in the green light sensing layer 112c refers to a percentage of the amount of the substance of In to a sum of the amounts of the substances of all positively-charged elements in the green light sensing layer 112c.

The content of In in the blue light sensing layer 113c refers to a percentage of the amount of the substance of In to a sum of the amounts of the substances of all positively-charged elements in the blue light sensing layer 113c.

Furthermore, in this embodiment, each value range includes endpoint values.

Therefore, in a case of blue light irradiation, the red light sensing sub-unit 111, the green light sensing sub-unit 112 and the blue light sensing sub-unit 113 each can generate light sensing electrical signals. In a case of green light irradiation, the red light sensing sub-unit 111 and the green light sensing sub-unit 112 can generate light sensing electrical signals. In a case of red light irradiation, only the red light sensing sub-unit 111 can generate light sensing electrical signals.

In this embodiment, at least one of the red light sensing layer 111c, the green light sensing layer 112c, or the blue light sensing layer 113c is a single layer structure. In other embodiments, at least one of the red light sensing layer 111c, the green light sensing layer 112c, or the blue light sensing layer 113c may also be a layer-stacked structure, for example, a multiple quantum well layer, including two barrier layers and a potential well layer sandwiched between the two barrier layers.

In this embodiment, as shown in FIG. 1, the red light sensing sub-unit 111 includes an N type first semiconductor layer 111a and a P type first semiconductor layer 111b, and the N type first semiconductor layer 111a and the P type first semiconductor layer 111b are located at both sides of the red light sensing layer 111c respectively; the green light sensing sub-unit 112 includes an N type second semiconductor layer 112a and a P type second semiconductor layer 112b, and the N type second semiconductor layer 112a and the P type second semiconductor layer 112b are located at both sides of the green light sensing layer 112c respectively; the blue light sensing sub-unit 113 includes an N type third semiconductor layer 113a and a P type third semiconductor layer 113b, and the N type third semiconductor layer 113a and the P type third semiconductor layer 113b are located at both sides of the blue light sensing layer 113c respectively. Any two of the N type first semiconductor layer 111a, the N type second semiconductor layer 112a and the N type third semiconductor layer 113a are disconnected and any two of the P type first semiconductor layer 111b, the P type second semiconductor layer 112b and the P type third semiconductor layer 113b are disconnected.

In other embodiments, the N type first semiconductor layer 111a, the N type second semiconductor layer 112a and the N type third semiconductor layer 113a may also be connected together, or the P type first semiconductor layer 111b, the P type second semiconductor layer 112b and the P type third semiconductor layer 113b are connected together.

In other embodiments, the P type first semiconductor layer 111b, the P type second semiconductor layer 112b and the P type third semiconductor layer 113b may also be close to the base 10, and the N type first semiconductor layer 111a, the N type second semiconductor layer 112a and the N type third semiconductor layer 113a are away from the base 10.

The material of at least one of the N type first semiconductor layer 111a, the N type second semiconductor layer 112a or the N type third semiconductor layer 113a may be N type GaN; the material of at least one of the P type first semiconductor layer 111b, the P type second semiconductor layer 112b or the P type third semiconductor layer 113b may be P type GaN or P type InGaN.

Figure 2:
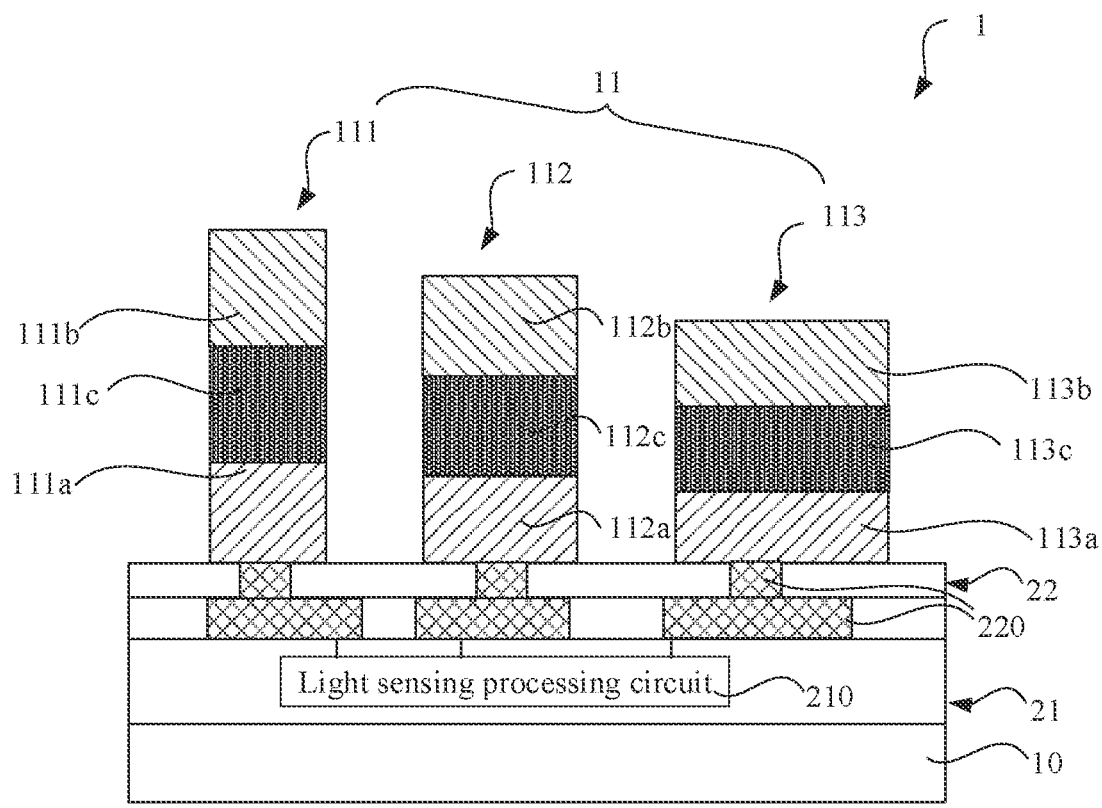
FIG. 2 is a schematic diagram illustrating a sectional structure of a GaN-based image sensor according to a first embodiment of the present disclosure.

Based on the light sensing unit 11 described above, the first embodiment of the present disclosure further provides a GaN-based image sensor. FIG. 2 is a schematic cross-sectional structure diagram illustrating a GaN-based image sensor.

As shown in FIG. 2, the GaN-based image sensor 1 includes:
- a base 21, including a light sensing processing circuit 210;
- a metal interconnection layer 22, located on a surface of the substrate 21 and internally provided with a metal interconnection structure 220; and
- a plurality of above light sensing units 11, located on the metal interconnection layer 22, where the red light sensing sub-unit 111, the green light sensing sub-unit 112 and the blue light sensing sub-unit 113 are electrically connected to the light sensing processing circuit 210 through the metal interconnection structure 220 to obtain a blue light incidence signal, a green light incidence signal and a red light incidence signal.

The light sensing processing circuit 210 may include a plurality of transistors on the base 10.

In this embodiment, since any two of the N type first semiconductor layer 111a, the N type second semiconductor layer 112a, the N type third semiconductor layer 113a are disconnected, that is, after the red light sensing sub-unit 111, the green light sensing sub-unit 112 and the blue light sensing sub-unit 113 generate light sensing electrical currents due to light irradiation, the N type first semiconductor layer 111a, the N type second semiconductor layer 112a and the N type third semiconductor layer 113a may have unequal potentials. Therefore, the N type first semiconductor layer 111a, the N type second semiconductor layer 112a and the N type third semiconductor layer 113a may be connected to the metal interconnection structure 220.

In other embodiments, when the N type first semiconductor layer 111a, the N type second semiconductor layer 112a and the N type third semiconductor layer 113a are connected together, and any two of the P type first semiconductor layer 111b, the P type second semiconductor layer 112b and the P type third semiconductor layer 113b are disconnected, the P type first semiconductor layer 111b, the P type second semiconductor layer 112b and the P type third semiconductor layer 113b may be connected to the metal interconnection structure 220.

The light sensing processing circuit 210 detects light sensing electrical signals generated by the red light sensing sub-unit 111, the green light sensing sub-unit 112 and the blue light sensing sub-unit 113.

Specifically, if the light sensing processing circuit 210 detects light sensing electrical signals at each of the red light sensing sub-unit 111, the green light sensing sub-unit 112 and the blue light sensing sub-unit 113 in one light sensing unit 11, a blue light incidence signal is stored;
if the light sensing processing circuit 210 detects light sensing electrical signals only at each of the red light sensing sub-unit 111 and the green light sensing sub-unit 112 in one light sensing unit 11, a green light incidence signal is stored;
if the light sensing processing circuit 210 detects light sensing electrical signals only at the red light sensing sub-unit 111 in one light sensing unit 11, a red light incidence signal is stored.

Figure 3:
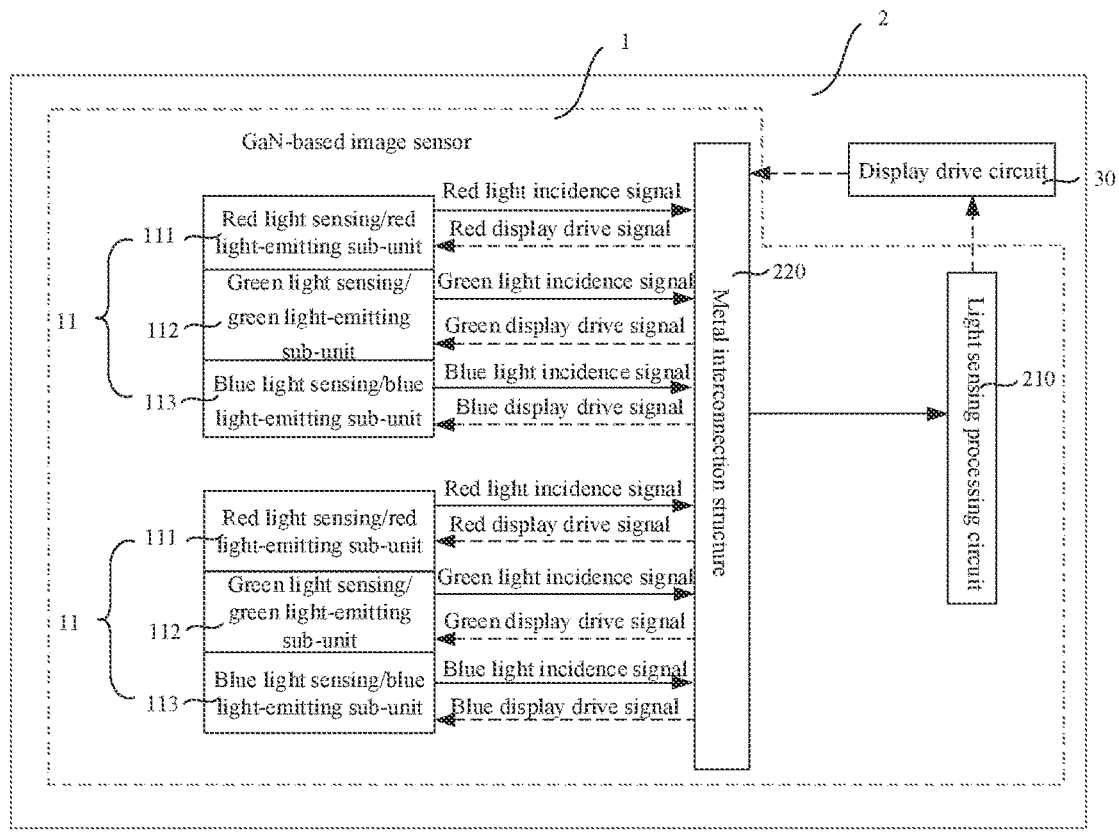
FIG. 3 is a modular structure diagram illustrating a display apparatus according to a second embodiment of the present disclosure.

FIG. 3 is a modular structural diagram illustrating a display apparatus according to a second embodiment of the present disclosure.

Based on the GaN-based image sensor of the first embodiment, the second embodiment of the present disclosure further provides a display apparatus.

As shown in FIG. 3, the display apparatus 2 includes:
- a GaN-based image sensor 1;
- a display drive circuit 30, where an input end of the display drive circuit 30 receives a red light incidence signal, a green light incidence signal and a blue light incidence signal of the light sensing unit 11 in a first region from the light sensing processing circuit 210, and generates a corresponding red display drive signal, a corresponding green display drive signal and a corresponding blue display drive signal;
- an output end of the display drive circuit 30 is connected with the metal interconnection structure 220, and the red display drive signal, the green display drive signal and the blue display drive signal are transmitted to a red light-emitting sub-unit, a green light-emitting sub-unit and a blue light-emitting sub-unit in a second region through the metal interconnection structure 220; where, the red light-emitting sub-unit is the red light sensing sub-unit 111, the green light-emitting sub-unit is the green light sensing sub-unit 112 and the blue light-emitting sub-unit is the blue light sensing sub-unit 113.

In the display apparatus 2 of the present embodiment, the GaN-based image sensor 1 can not only achieve light sensing function but also realize display function.

The display apparatus 2, for example, may realize a true full screen display (full view display) and achieve light sensing function through light-emitting units without disposing one or more cameras and regions in the display screen for disposing the one or more cameras.

When the light sensing unit 11 in the first region senses light, the metal interconnection structure 220 is connected with the light sensing processing circuit 210 and disconnected with the display drive circuit 30, and the GaN-based image sensor 1 achieves light sensing function; when the light-emitting units in the second region perform displaying, the metal interconnection structure 220 is disconnected with the light sensing processing circuit 210 and connected with the display drive circuit 30, and the GaN-based image sensor 1 achieves display function.

Since the metal interconnection structure 220 has two states, the light sensing function and the display function can be carried out in a time-sharing manner. For example, in one frame of refresh period, the light sensing function is achieved in the former part of the period, that is, image collection is carried out; the display function is achieved in the latter part of the period, that is, the collected image is displayed.

As shown in FIG. 3, in this embodiment, the first region and the second region are a same region. In other words, after light is irradiated on the light sensing unit 11, the red light sensing sub-unit 111 in the light sensing unit 11 generates a red light incidence signal, the red light incidence signal passes the display drive circuit 30 to generate a corresponding red display drive signal, the red display drive signal is displayed on the same red light sensing sub-unit 111. The green light sensing sub-unit 112 and the blue light sensing sub-unit 113 operate in the similar way.

The first region and the second region may be all or part of a display region of the display apparatus. For example, a picture taken by a user is displayed across a full screen or in a window.

Figure 4:
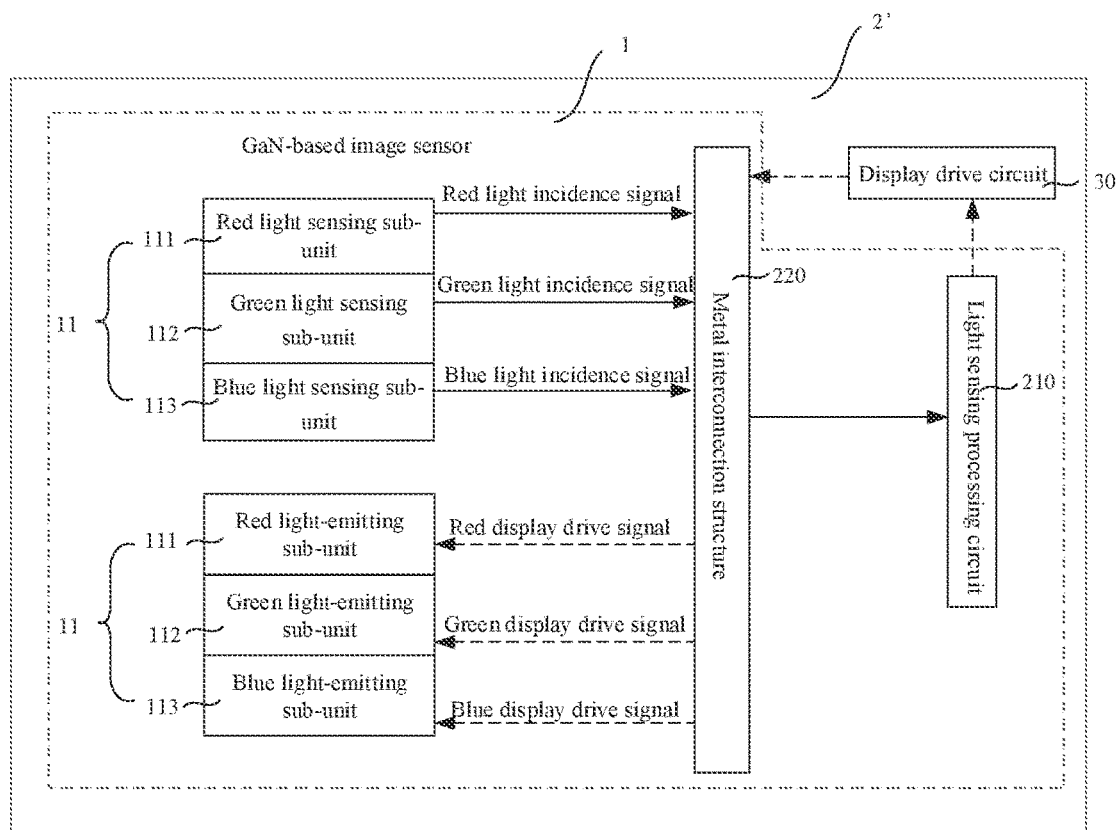
FIG. 4 is a modular structure diagram illustrating a display apparatus according to a third embodiment of the present disclosure.

FIG. 4 is a modular structure diagram illustrating a display apparatus according to a third embodiment of the present disclosure. As shown in FIG. 4, the display apparatus 2' in this embodiment is substantially same as the display apparatus 2 of the second embodiment, except that the first region and the second region are different. In other words, the light sensing unit 11 and the light-emitting unit are different.

Image data can be processed such that the first region has a larger area than the second region or the first region has a smaller area than the second region.

In some embodiments, the first region and the second region may also be partially overlapped.

Although the present disclosure is described as above, the present disclosure is not limited hereto. Various modification and changes may be made by those skilled in the art without departing from the spirit and scope of the present disclosure. Thus, the scope of protection of the present disclosure shall be limited by the appended claims.

The invention claimed is:

1. A GaN-based image sensor, comprising:
a substrate, wherein the substrate comprises a light sensing processing circuit;
a metal interconnection layer, located on a surface of the substrate and internally provided with a metal interconnection structure; and
a plurality of light sensing units located on the metal interconnection layer, wherein for each of the plurality of light sensing units, the light sensing unit comprises: a red light sensing sub-unit, a green light sensing sub-unit and a blue light sensing sub-unit; the red light sensing sub-unit, the green light sensing sub-unit, and the blue light sensing sub-unit located on a same layer in a direction perpendicular to a plane where the substrate is located; materials of a red light sensing layer of the red light sensing sub-unit, a green light sensing layer of the green light sensing sub-unit, and a blue light sensing layer of the blue light sensing sub-unit are all gallium nitride(GaN)-based materials containing indium(In); the materials of the red light sensing layer, the green light sensing layer and the blue light sensing layer contain different contents of In, enabling the red light sensing sub-unit, the green light sensing sub-unit and the blue light sensing sub-unit to generate or not generate light sensing electrical signals in response to different wave lengths of received light; and the red light sensing sub-unit, the green light sensing sub-unit and the blue light sensing sub-unit are electrically connected to the light sensing processing circuit through the metal interconnection structure to obtain a blue light incidence signal, a green light incidence signal and a red light incidence signal;
wherein a first forward projection area of the red light sensing sub-unit on the substrate is smaller than a second forward projection area of the green light sensing sub-unit on the substrate, and a first component content of In in the material of the red light sensing layer of the red light sensing sub-unit is greater than a second component content of In in the material of the green light sensing layer of the green light sensing sub-unit;
wherein the second forward projection area of the green light sensing sub-unit on the substrate is smaller than a third forward projection area of the blue light sensing sub-unit on the substrate, and the second component content of In in the material of the green light sensing layer of the green light sensing sub-unit is greater than a third component content of In in the material of the blue light sensing layer of the blue light sensing sub-unit.

2. The GaN-based image sensor of claim 1, wherein, the red light sensing sub-unit comprises:
an N type first semiconductor layer, and
a P type first semiconductor layer, wherein the N type first semiconductor layer and the P type first semiconductor layer are located at both sides of the red light sensing layer respectively;
the green light sensing sub-unit comprises:
an N type second semiconductor layer, and
a P type second semiconductor layer, wherein the N type second semiconductor layer and the P type second semiconductor layer are located at both sides of the green light sensing layer respectively;
the blue light sensing sub-unit comprises:
an N type third semiconductor layer, and
a P type third semiconductor layer, wherein the N type third semiconductor layer and the P type third semiconductor layer are located at both sides of the blue light sensing layer respectively;
wherein (a) the N type first semiconductor layer, the N type second semiconductor layer and the N type third semiconductor layer, or (b) the P type first semiconductor layer, the P type second semiconductor layer and the P type third semiconductor layer are connected to the metal interconnection structure to input light sensing electrical signals generated by the red light sensing sub-unit, the green light sensing sub-unit and the blue light sensing sub-unit to the light sensing processing circuit.

3. The GaN-based image sensor of claim 1, wherein, the light sensing processing circuit detects light sensing electrical signals generated by the light sensing unit;
in response to determining that the light sensing processing circuit detects the light sensing electrical signals at each of the red light sensing sub-unit, the green light sensing sub-unit and the blue light sensing sub-unit in the light sensing unit, the blue light incidence signal is stored;
in response to determining that the light sensing processing circuit detects the light sensing electrical signals only at each of the red light sensing sub-unit and the green light sensing sub-unit in the light sensing unit, the green light incidence signal is stored;
in response to determining that the light sensing processing circuit detects the light sensing electrical signals only at the red light sensing sub-unit in the light sensing unit, the red light incidence signal is stored.

4. A display apparatus, comprising:
a GaN-based image sensor comprising:
a substrate, wherein the substrate comprises a light sensing processing circuit;
a metal interconnection layer, located on a surface of the substrate and internally provided with a metal interconnection structure; and
a plurality of light sensing units located on the metal interconnection layer, wherein for each of the plurality of light sensing units, the light sensing unit comprises: a red light sensing sub-unit, a green light sensing sub-unit and a blue light sensing sub-unit; materials of a red light sensing layer of the red light sensing sub-unit, a green light sensing layer of the green light sensing sub-unit, and a blue light sensing layer of the blue light sensing sub-unit are all gallium nitride(GaN)-based materials containing indium(In); the materials of the red light sensing layer, the green light sensing layer and the blue light sensing layer contain different contents of In, enabling the red light sensing sub-unit, the green light sensing sub-unit and the blue light sensing sub-unit to generate or not generate light sensing electrical signals in response to different wave lengths of received light; and the red light sensing sub-unit, the green light sensing sub-unit and the blue light sensing sub-unit are electrically connected to the light sensing processing circuit through the metal interconnection structure to obtain a blue light incidence signal, a green light incidence signal and a red light incidence signal;

a display drive circuit, wherein an input end of the display drive circuit receives the red light incidence signal, the green light incidence signal and the blue light incidence signal of the light sensing unit in a first region from the light sensing processing circuit, and correspondingly generates a red display drive signal, a green display drive signal and a blue display drive signal; and an output end of the display drive circuit is connected with the metal interconnection structure, and the red display drive signal, the green display drive signal and the blue display drive signal are transmitted to a red light-emitting sub-unit, a green light-emitting sub-unit and a blue light-emitting sub-unit in a second region through the metal interconnection structure; wherein, the red light-emitting sub-unit is the red light sensing sub-unit, the green light-emitting sub-unit is the green light sensing sub-unit and the blue light-emitting sub-unit is the blue light sensing sub-unit.

5. The display apparatus of claim 4, wherein (a) the first region and the second region are a same region, (b) the first region has a larger area than the second region, or (c) the first region has a smaller area than the second region.

6. The display apparatus of claim 4, wherein the GaN-based image sensor and the display drive circuit are configured to perform a light sensing function and a display function, respectively, in a time-sharing manner such that when the light sensing unit in the first region senses light, the metal interconnection structure is connected with the light sensing processing circuit and disconnected with the display drive circuit; when a light-emitting unit in the second region performs displaying, the metal interconnection structure is disconnected with the light sensing processing circuit and connected with the display drive circuit.

7. The display apparatus of claim 4, wherein,
in response to blue light irradiation, the red light sensing sub-unit, the green light sensing sub-unit and the blue light sensing sub-unit each generate light sensing electrical signals;
in response to green light irradiation, the red light sensing sub-unit and the green light sensing sub-unit generate the light sensing electrical signals; and
in response to red light irradiation, only the red light sensing sub-unit generates at least one of the light sensing electrical signals.

8. The display apparatus of claim 4, wherein,
the red light sensing sub-unit comprises:
an N type first semiconductor layer, and
a P type first semiconductor layer, wherein the N type first semiconductor layer and the P type first semiconductor layer are located at both sides of the red light sensing layer respectively;
the green light sensing sub-unit comprises:
an N type second semiconductor layer, and
a P type second semiconductor layer, wherein the N type second semiconductor layer and the P type second semiconductor layer are located at both sides of the green light sensing layer respectively;
the blue light sensing sub-unit comprises:
an N type third semiconductor layer, and
a P type third semiconductor layer, wherein the N type third semiconductor layer and the P type third semiconductor layer are located at both sides of the blue light sensing layer respectively.

9. The display apparatus of claim 4, wherein,
the content of In in the red light sensing layer is in a range of 0.4-0.6;
the content of In in the green light sensing layer is in a range of 0.2-0.3;
the content of In in the blue light sensing layer is in a range of 0.01-0.1.

10. The display apparatus of claim 4, wherein,
the red light sensing sub-unit comprises:
an N type first semiconductor layer, and
a P type first semiconductor layer, wherein the N type first semiconductor layer and the P type first semiconductor layer are located at both sides of the red light sensing layer respectively;
the green light sensing sub-unit comprises:
an N type second semiconductor layer, and
a P type second semiconductor layer, wherein the N type second semiconductor layer and the P type second semiconductor layer are located at both sides of the green light sensing layer respectively;
the blue light sensing sub-unit comprises:
an N type third semiconductor layer, and
a P type third semiconductor layer, wherein the N type third semiconductor layer and the P type third semiconductor layer are located at both sides of the blue light sensing layer respectively;
wherein (a) the N type first semiconductor layer, the N type second semiconductor layer and the N type third semiconductor layer, or (b) the P type first semiconductor layer, the P type second semiconductor layer and the P type third semiconductor layer are connected to the metal interconnection structure to input light sensing electrical signals generated by the red light sensing sub-unit, the green light sensing sub-unit and the blue light sensing sub-unit to the light sensing processing circuit.

* * * * *